United States Patent [19]

Dutkewych

[11] Patent Number: 4,695,505
[45] Date of Patent: Sep. 22, 1987

[54] DUCTILE ELECTROLESS COPPER

[75] Inventor: Oleh B. Dutkewych, Harvard, Mass.

[73] Assignee: Shipley Company Inc., Newton, Mass.

[21] Appl. No.: 791,597

[22] Filed: Oct. 25, 1985

[51] Int. Cl.⁴ .......................... B05D 1/00; B05D 3/06
[52] U.S. Cl. .................................. 428/209; 106/1.23; 427/54.1
[58] Field of Search ........................ 428/209; 106/1.23; 427/54.1

[56] References Cited

U.S. PATENT DOCUMENTS 4,548,644 10/1985 Nakaso et al. ...................... 106/1.23

OTHER PUBLICATIONS

High Density Printed Wiring Boards by Additive Processes, May 22-25, 1984, Kamiyama et al, p. 5.
Microstructure and Ductility of Electroless Copper Deposits, Nakahara et al., 1983, Pergamon Press Ltd., p. 713.

Primary Examiner—John E. Kittle
Assistant Examiner—Patrick J. Ryan
Attorney, Agent, or Firm—Robert L. Goldberg

[57] ABSTRACT

An electroless copper deposit having an elongation capability of at least 10 percent as determined by a mechanical bulge test on a foil having a thickness of between 1.5 and 2.0 mils.

14 Claims, 2 Drawing Figures

DUCTILE ELECTROLESS COPPER

This invention relates to an electroless copper deposit having an elongation capability of ten percent or greater, as measured by a standardized procedure described in detail below, and to a plating solution capable of plating such a deposit.

DESCRIPTION OF THE PRIOR ART

Electroless copper deposition refers to the chemical plating of copper over a clean, catalytically active surface by chemical reduction in the absence of an external electric current. Processes and compositions for electroless deposition of copper are known in the art and are in substantial commercial use. They are disclosed in a number of prior art patents, for example, U.S. Pat. Nos. 3,615,732; 3,615,733; 3,615,735; 3,728,137; 3,846,138; 4,229,218; and 4,539,044, all incorporated herein by reference.

Known electroless copper deposition solutions generally comprise four ingredients dissolved in water. They are (1) a source of cupric ions, usually a copper salt such as copper sulfate, (2) a reducing agent such as formaldehyde, or preferably a formaldehyde precursor such as paraformaldehyde, (3) hydroxide, generally an alkali metal hydroxide and usually sodium hydroxide, sufficient to provide the required alkalinity necessary for said composition to be effective and (4) a complexing agent for copper sufficient to prevent its precipitation in alkaline solution. A large number of complexing agents are known and described in the aforesaid cited patents and elsewhere.

Electroless copper plating solutions have many industrial uses. One use is for the manufacture of printed circuit boards where an electroless copper deposit plated over the walls of through-holes, vias, interconnects, etc. provides conductivity between surfaces of a board and/or between circuit layers. In additive circuit manufacture, in addition to providing conductivity between surfaces and/or circuit layers, the deposit also serves as the conductor lines.

With increased circuit density, and with more rigorous specifications for circuit boards, the mechanical properties of a deposit become increasingly important, especially deposit ductility. For example, in the manufacture of electronic devices, it is necessary to solder components to a circuit board. The solder increases the temperature of the electroless deposit which causes it to expand and then contract with cooling. The coefficient of expansion of the copper differs from the coefficient of expansion of the surface over which the copper is plated. Therefore, stress is created in the copper which can cause cracking of the deposit. A crack in the deposit can result in failure of the circuit board. To determine the ability of an electroless copper deposit to withstand soldering, a test method has been developed known as the solder shock test. This test will be described in greater detail below.

Electroless copper is significantly less ductile than other forms of copper such as electrolytically deposited copper. For example, electroless copper typically possesses elongations of about 0.5 to 3.5 percent while electrolytic copper, as used in the manufacture of through-hole printed circuit boards, typically possesses elongations in the range of from about 6 to 15 percent. As reported by Nakahara et al, *Acta Metall*, Volume 3, No. 5. pp. 713–724, 1983, United Kingdom, the art has attributed poor ductility in part to hydrogen embrittlement. The need for a ductile electroless copper for the manufacture of printed circuit boards is recognized throughout the industry and has been discussed in technical papers including Nakaso et al, Mechanical Properties of Electroless Copper Deposits, (Technical Paper No. WCIII-10, Kamiyama et al, High Density Printed Wiring Boards by Additive Processes, (Technical Paper No. WCIII-11) and Debrita, High Reliability Electroless Copper For Fully Additive Printed Wiring Board Manufacture, (Technical Paper WCIII-69), all presented at the Printed Circuit World Convention III held in Washington, D.C. on May 22 through May 25, 1984, incorporated herein by reference.

Though the literature deals extensively with the ductility of copper, the measurement of electroless copper ductility is complex because the literature reports ductility as determined by a variety of test methods which do not correlate with each other. A method frequently used to determine ductility is the bend test where a copper foil is repeatedly folded and opened until it breaks. The number of bends achieved is used as a measurement of ductility. Though the test is easy to perform, it is not a true measure of ductility in metallurgical terms and it is unreliable because the foil becomes work hardened by bending which makes it difficult to refold the foil exactly at the point of the initial crease. In summary, the bend test is a measure of bendability, not a true measure of ductility or elongation. Foils that have passed the bend test in accordance with U.S. Pat. No. 3,257,215 possess elongations as determined by the mechanical bulge test of less than 5% and are not ductile deposits in accordance with the invention described herein.

Another test used by the art is one where the copper is stretched in one dimension until it yields. Percent elongation is then determined. This test, though superior to the bend test, is nonetheless unreliable because the ductility of an electroless copper deposit can vary from one axis to another.

A further complication encountered in the literature dealing with the ductility of an electroless deposit is that specimen thickness is not standardized. It is known in the art that ductility is related to the cross-sectional thickness of a copper foil. However, foil thickness is often not standardized during ductility testing, and it is difficult to repeat and confirm ductility measurements reported in the literature. The importance of foil thickness on ductility determination is described by Nakahara et al, A Simple Ductility Tester for Metal Films, *Journal of Testing and Evaluation*, JTEVA, Volume 5, No. 3, May 1977, pp. 178–182, incorporated herein by reference.

Regardless of the method used to determine ductility of an electroless copper deposit and regardless of values reported in the literature, it is believed that the art of manufacturing printed circuit boards has been impeded by the unavailability of a stable electroless copper plating solution capable of yielding an electroless copper deposit of satisfactory ductility within a reasonably acceptable plating time. Consequently, the art is continuously searching for electroless copper deposition solutions capable of depositing ductile deposits at plating rates in excess of 0.05 mils per hour.

SUMMARY OF THE INVENTION

The invention described herein is a deposit of electroless copper having an elongation capability, expressed as percent elongation, of at least ten percent or greater. As will be discussed in detail below, elongation capability is determined using standardized equipment and procedures.

The ductile copper deposit, in accordance with the invention, is obtained from a stable electroless copper plating solution capable of plating copper at a rate in excess of 0.05 mils per hour and preferably in excess of 0.10 mils per hour. Each component of the plating solution is believed to be known in the art, but the specific admixture of solution components in accordance with the invention provides a stable plating solution capable of plating a deposit having ductility substantially in excess of the ductility of copper deposited from prior art plating solutions.

DESCRIPTION OF THE PREFERRED EMBODIMENTS

To clearly define elongation capability, determinations were made by the procedure established by Nakahara et al reported in the *Journal of Testing and Evaluation*, referenced above. All tests were performed on a copper foil having a thickness within the range of 1.5 and 2.0 mils, this thickness having been selected because it has been found that though elongation readings vary appreciably with thickness, the variation becomes minimal as the thickness exceeds 1.5 mils.

Figure 1:
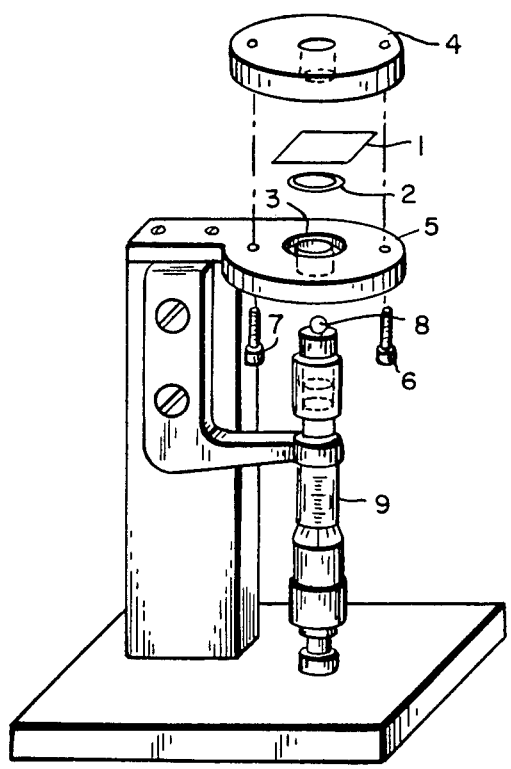
FIG. 1 is an exploded view of a device for determining elongation of a test sample.
Figure 2:
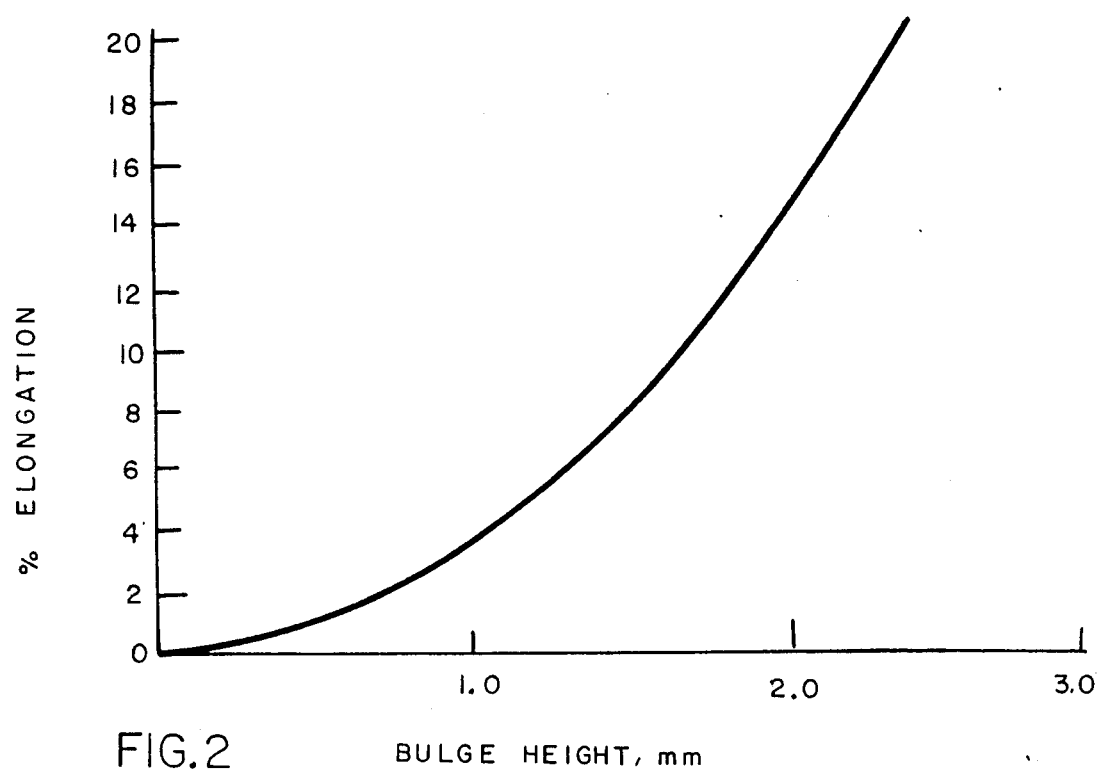
FIG. 2 is a graphical representation of bulge height from use of the device of FIG. 1 as a function of percent elongation of a test sample.

The procedure used to determine elongation capability utilized a mechanical bulge tester illustrated in FIG. 1 of the drawings. A foil specimen 1 placed over an O ring 2 within groove 3 is clamped between two doughnut-shaped platens 4 and 5. The platens are joined with screws 6 and 7. Specimen 1 is then slowly deformed into a nearly spherical shape by steel ball 8 driven by micrometer 9. By observing deformation under a low magnification eye piece (not shown), the bulge height at the onset of fracture can be accurately determined. The sample tested is large relative to the size of the ball and multiple drformations are used per test to determine elongation capability. On a sample measuring 4 inches by 4 inches, 25 or more deformations can be used to determine the elongation capability. Using the calculations given by Nakahara et al, a graph relating bulge height with percent elongation can be constructed. The graph used for determining elongation values reported herein is depicted in FIG. 2 of the drawings. The above procedure will be referred to as the mechanical bulge test in the discussion which follows.

To further standardize the results obtained, the plating procedure used to obtain electroless copper test foils was standardized and elongation values were derived from foils plated in accordance with this procedure. The procedure comprised:

a. provide a flat molded ABS plaque of suitable size sufficient to provide several 1" by 1" squares;

b. immerse ABS plaque in a solution of PM 940 chromic acid conditioner for from 5 to 10 minutes at 155° F. and water rinse thoroughly;

c. immerse ABS plaque in a 5% aqueous solution of Neutralizer Cleaner Conditioner 1175 for 5 minutes at 180° F. and water rinse thoroughly;

d. immerse ABS plaque in a solution of Cataprep 404 conditioner for 1 minute at 110° F.;

e. immerse ABS plaque in a 3% solution of Cataposit 44 tin palladium catalyst for 5 minutes at a temperature of 110° F. and water rinse thoroughly;

f. immerse ABS plaque in a solution of Accelerator 19 for 5 minutes at room temperature and water rinse thoroughly;

g. immerse ABS plaque in a solution of the test electroless copper solution at a temperature suitable for the test solution and for a time sufficient to build a deposit of from 1.5 to 2.0 mils; and h. cut a sample of the copper deposit in a square measuring about 1" by 1", peel from the ABS plaque and submit to mechanical bulge testing as described above. In the aforesaid procedure, Cataprep and Cataposit are registered trademarks of Shipley Company Inc. Those solutions identified as PM 940, Neutralizer Cleaner Conditioner 1175, Cataprep 404, Cataposit 44 and Accelerator 19 are all commercially available materials from Shipley Company Inc. of Newton, Mass. 02162.

The mechanical bulge test procedure permits the operator to microscopically view the stretching and expansion of the deposit sample as the test proceeds and the bulge forms. This permits the operator to determine if the fracture emanates from the apex of the bulge or at some other point in the bulge.

To accurately determine elongation capability using the mechanical bulge test, it is necessary to measure defect-free electroless copper. Imperfections in the sample may cause premature fracture of the sample. These imperfections may be caused by sample preparation rather than an inherent defect in the sample. For example, preparation of defect free samples by the plating process described above is difficult, primarily because of the necessity to etch roughen the surface of the ABS plaque to improve adhesion of the copper deposit to the plaque. The bond between the substrate and the deposit is apt to cause defects during the step of peeling the copper from the plaque which are not in the deposit as plated, but rather are formed as the sample is removed from the substrate for purposes of testing.

When a sample tested using the mechanical bulge tester fractures at a point beneath the apex of the bulge, it is likely that the sample has an imperfection that results in premature fracture. If the tested sample fractures at the apex, the sample is typically free of obvious defects through the sample may still contain a defect at the apex. For this reason, when reporting elongation capability herein, a sample is subjected to multiple testing using the mechanical bulge tester and those tests where fracture occurs at the apex of the bulge and where maximum elongation values are obtained are used to determine elongation capability.

Elongation capability values given herein have been determined using the standardized procedure described above with the test specimen having a thickness of from 1.5 to 2.0 mils. This is not to be interpreted to mean that the invention is limited to foils having a thickness within the range of 1.5 to 2.0 mils. The invention is directed to a copper foil of any desired thickness, but if plated to a thickness of from 1.5 to 2.0 mils, would exhibit an elongation capability of 10 percent or greater as determined by the mechanical bulge test.

Copper plating solutions capable of depositing copper having an elongation capability of 10 percent or greater in accordance with the invention use ingredients that have been used in prior art copper plating solution, but not in the specific combinations disclosed herein. In addition, the plating solutions of the invention contain nickel and cyanide ions in concentrations that do not deleteriously affect elongation. Further, the plating solutions of the invention are free or ingredients, additives, impurities, and other substances in concentrations that deleteriously affect ductility. Finally, to plate copper to a desired thickness, the plating solutions should contain one or more stabilizers capable of adequately stabilizing the solution in concentrations that do not deleteriously affect elongation capability.

The copper plating solutions of the invention necessarily include a source of cupric ions, formaldehyde and hydroxide. These constituents are conventional in electroless plating solutions and are used in known concentrations. Hydroxide is used in an amount sufficient to adjust solution pH to between about 11.0 and 14.0 and preferably between about 12.0 and 13.0, the preferred operating pH of the bath.

The copper plating solutions of the invention also require a complexing agent. The solutions can be formulated with known complexing agents that do not interfere with ductility in required concentrations. Since one object of the invention is a ductile deposit from a plating solution capable of plating copper at a rapid rate, the most preferred complexing agent is N,N,N',N'-tetrakis (2-hydroxpropyl) - ethylene diamine commercially available under the tradename "Quadrol". This complexing agent and similar complexing complexing agents are disclosed in U.S. Pat. No. 3,329,512 incorporated herein by referenee. Another preferred complexing agent is the alkali metal salt of ethylene diamine tetraacetic acid which can be used alone or in combination with Quadrol. The complexing agent is used in an amount preferably in excess of the amount required to complex the copper ions in solution, but not in an amount that would deleteriously affect the ductility of the deposit.

As stated above, to obtain a solution capable of plating a copper deposit containing codeposited nickel and having an elongation capability of 10 percent or greater as determined using the mechanical bulge tester, it is necessary to include a minor amount of a source of nickel ions and cyanide and/or ferrocyanide ions in the plating solution. With an adequate concentration of cyanide ions, an increase in elongation capability is realized when the nickel ion content is as low as about 5 parts per million parts of solution (ppm). For the test solutions described below, it was necessary that nickel content reach 40 ppm to obtain an elongation of 10 percent. As nickel ion concentration increases, elongation capability increases, then levels off, and then begins to gradually decrease. Preferably, nickel ion concentration varies between about 40 and 1,000 ppm and more preferably, between about 40 and 500 ppm.

Cyanide as a stabilizer and an agent that increases the bendability of a copper deposit is shown in U.S. Pat. No. 3,257,215, incorporated herein by reference. It can be introduced into the electroless copper solution in the form of its salts such as sodium cyanide, potassium cyanide, copper cyanide, nickel cyanide, etc. The cyanide ion in solution is a solution poison i.e., it will first retard and then prevent deposition of copper from solution. Therefore, it can be added to solution in limited concentration. Cyanide ions are used in an amount of from about 1 ppm to that amount that retards or prevents deposition of copper from solution.

The plating solutions described above plate copper having an elongation capability of 10% or greater but it is desirable to add other ingredients to the solution such as stabilizers, exaltants, brighteners, etc. Such additives can be used in the solutions of this invention if used in concentrations that do not deleteriously affect elongation.

Stabilizers prevent copper plating solutions from undergoing spontaneous decomposition. Many stabilizers have been disclosed in the prior art as suitable for stabilizing electroless copper plating solution. A conventional stabilizer comprises a divalent sulfur compound such as mercapto benzo thiazole. Divalent sulfur compounds embrittle the copper deposit when used in interfering concentrations.

Alkyne alcohols disclosed in U.S. Pat. No. 3,661,597, in stabilizing concentrations, stabilize the plating solutions of the invention without noticeable affect on deposit ductility. Methyl butynol is the preferred alkyne alcohol. Another stabilizer that can be used alone or in combination with the alkyne alcohol is 2,2'-dipyridyl disclosed in U.S. Pat. No. 4,099,974. Mercury compounds disclosed in U.S. Pat. Nos. 3,663,242 and 3,649,308 stabilize the solutions of the invention, but excessive amounts embrittle the deposit. Phenyl mercuric acetate is preferred.

Aeration, as known in the art, can assist in stabilizing the solutions of the invention without noticeable affect on deposit ductility.

The electroless copper solutions of the invention are operated in a manner similar to prior art solutions. A part is immersed in the solution for a time sufficient to plate the part to desired thickness. The plating solution is preferably operated at an elevated temperature, preferably within a range of from 100° to 175° F. and more preferably within a range of from 135° to 150° F. Solution agitation is desirable.

The following examples will better illustrate the invention.

Example 1

| Copper nitrate dihydrate | 6.8 gms |
| nickel sulfate hexahydrate | 0.2 gms |
| Quadrol | 12.8 gms |
| paraformaldehyde | 1.5 gms |
| methyl butynol | 35 mgs |
| phenyl mercuric acetate | 3 mgs |
| potassium ferrocyanide trihydrate | 60 mgs |
| 2,2'-dipyridyl | 30 mgs |
| Pluronic F68 | 25 mgs |
| sodium hydroxide (liquid form) | 16.0 gms |
| water | to 1 liter |
| Operating temperature | 135-140° F. |

The above solution constitutes the most preferred embodiment of the invention.

The above solution was used to plate an ABS part to a thickness of 1.5 mils. The plated deposit was subjected to the mechanical bulge test described above and found to have an elongation capability of greater than 12%. For purposes of comparison, the plating procedure described above was used to plate a 1.5 mil thick copper deposit from a commercially available electroless copper plating solution identified as Cuposit ® CP 70 available from Shipley Company Inc. of Newton, Mass. The elongation capability was found to be less than 3%.

The above solution used cupric nitrate as the source of cupric ions rather than cupric sulfate as is conventional in the formulation of electroless copper plating solutions. While cupric sulfate may successively be utilized, it has disadvantages during replenishment of cupric ions because of accumulation of excessive quantities of sulfate ion in solution. Excessive sulfate ion interferes with ductility. Conversely, it is a discovery of this invention that monovalent anions, most preferably nitrate and formate ions, can be tolerated in higher concentration without deleteriously effecting ductility.

When used for the fabrication of plated through hole printed circuit boards, it is essential that the electroless copper plated onto the hole walls pass a solder shock test. The solder shock test used herein involved plating of a test solution onto the walls of through holes in a double copper clad FR4 glass epoxy substrate having a thickness of either 62 or 92 mils and 30 to 40 mil holes. The test comprises floatation of the plated part on molten solder at a temperature of about 500° F. for 10 seconds. The copper deposits of this invention pass a solder shock test without evidence of fracture, whereas parts plated with Cuposit® CP-70 repeatedly fail the solder shock test. Using a bend test, the Cuposit® CP-70 deposits exhibit excellent bendability, but do not possess the elongation capability of the deposits of this invention.

To obtain consistent results, electroless copper solutions need to be maintained near full strength with respect to the concentrations of copper, nickel, formaldehyde and hydroxide. On a laboratory scale, this can be accomplished by preparing at least 12 liters of plating solution without addition of sodium hydroxide until the solutions are ready for use. When ready to test the plating solution, the liquid sodium hydroxide is added to 1 liter of solution and a part is immersed in the solution to commence plating. After 1 hour of plating, the plated part is transferred to a second "fresh solution" to which sodium hydroxide has been added and the part is again plated for 1 hour. This sequence is continued until full desired thickness is obtained. If more than 10% of the original copper is consumed during plating from a 1 liter solution, it is necessary to change solutions. If the operating temperature of the solution is higher than about 140° F., it might be necessary to change solutions more often than every hour as formaldehyde consumption might become excessive. Gentle agitation of the solution and the part is desirable during plating.

Example 2

The procedure of Example 1 was repeated, but the nickel sulfate was omitted from solution. The copper deposit passed the bend test, but had an elongation capability approaching 3%. The deposits were not sufficiently ductile for purposes of this invention and the deposits failed the solder shock test.

Example 3

The procedure of Example 1 was repeated, but the potassium ferrocyanide was omitted from solution. As above, the copper deposit passed the bend test, but had an elongation capability approaching 3%. Again, the deposits were not sufficiently ductile for purposes of this invention and the deposits failed the solder shock test.

Example 4

The procedure of Example 3 was repeated, but the nickel sulfate concentration was increased to 700 ppm (156 ppm nickel ions). The deposit formed had an elongation capability of almost 4%, but failed the solder shock test. This example illustrates that ferrocyanide ions are needed in addition to nickel ions.

Example 5

The procedure of Example 1 was repeated, but the concentration of nickel ions in solution was varied from 0 to 450 ppm. Elongation capability is set forth in the following table:

| Nickel Sulfate in solut. (ppm) | Nickel ions in solut. (ppm) | Elongation Capability (%) | Nickel in deposit (ppm) |
|---|---|---|---|
| 0 | 0 | less than 3% | 0 |
| 50 | 11 | almost 6% | 17 |
| 200 | 45 | more than 12% | 74 |
| 400 | 90 | more than 13% | 153 |
| 700 | 156 | more than 15% | 234 |
| 1,000 | 223 | more than 15% | (1) |
| 1,500 | 335 | more than 14% | 280 |
| 2,000 | 446 | more than 11% | 236 |

(1) not measured.

Deposits having an elongation capability of 10% or greater were obtained from solutions having a nickel ion concentration ranging from abut 40 ppm to substantially more than 450 ppm.

Examples 6 to 10

The procedure of Example 1 was repeated, but the concentration of nickel sulfate was increased to 0.7 grams and the concentrations of several other ingredients were modified as set forth in the following table:

| Ex. No. | Ingredient | Amount | Elongation Capability | Solder Test |
|---|---|---|---|---|
| 6 | phenyl mercurio acetate | 9 mgs | less than 4% | failed |
| 7 | potassium ferrocyanide | 250 mgs | more than 15% | passed |
| 8 | potassium ferrocyanide | 1,000 mgs | more than 15% | passed |
| 9 | 2,2'-dipyridyl | 60 mgs | more than 14% | passed |
| 10 | 2,2'-dipyridyl | 90 mgs | more than 14% | passed |

The above examples illustrate that stabilizers vary in concentration tolerance. Thus, phenyl mercuric acetate may be used as a stabilizer in a limited concentration, but as its concentration increases, it deleteriously affects elongation capability.

Example 11

The procedure of Example 1 was repeated with 4 mgs of thiomalic acid (a known divalent sulfur stabilizer) added to the solution. The deposit obtained had an elongation capability of about 3%, passed the bend test, but failed the solder shock test. This example illustrates that a plating solution able to deposit copper having excellent elongation properties may be destroyed by extremely small amounts of an additive that embrittles the deposit.

Example 12

The procedure of Example 1 was repeated with variations in temperature of deposition. The temperature used and the affect on plating rate and elongation capability is set forth in the following table:

| Solution Temp. °F. | Plating Time (hrs) | Plating Rate (mil/hr) | Elongation Capability (%) |
| --- | --- | --- | --- |
| 120 | 16 | 0.09 | more than 12 |
| 140 | 11 | 0.14 | more than 12 |
| 165 | 7 | 0.21 | more than 12 |

Temperature affects rate, but not elongation capability, within the range set forth above.

I claim:

1. An electroless deposit of copper containing a minor amount of codeposited nickel and having an elongation capability of at least 10 percent wherein, said deposit is made by deposition from an electroless copper plating solution capable of depositing electroless copper having an elongation capability of at least 10 percent, said solution being characterized by the presence of nickel ions, a member selected from the group of cyanide ions, ferrocyanide ions and mixtures thereof, a source of formaldehyde, hydroxyl radicals, Quadrol, and by the absence of substances in concentrations that would reduce elongation below about 10 percent.

2. The deposit of claim 1 where elongation capability is determined by mechanical bulge testing of a foil having a thickness of between 1.5 and 2.0 mils.

3. The deposit of claim 1 containing codeposited nickel in an amount of at least about 30 ppm.

4. The deposit of claim 3 where the nickel content is at least about 100 parts per million parts of the deposit.

5. An electroless copper plating solution capable of depositing electroless copper having an elongation capability of at least 10 percent, said solution being characterized by the presence of nickel ions, a member selected from the group of cyanide ions, ferrocyanide ions and mixtures thereof, a source of formaldehyde, hydroxyl radicals, Quadrol, and by the absence of substances in concentrations that would reduce elongation below about 10 percent.

6. The plating solution of claim 5 wherein elongation capability is determined by mechanical bulge testing of a foil having a thickness of between 1.5 and 2.0 mils.

7. The plating solution of claim 5 capable of plating at a rate of at least about 0.05 mils per hour.

8. The plating solution of claim 5 capable of plating at a rate of at least about 0.10 mils per hour.

9. The plating solution of claim 5 wherein the source of the cupric ions is a salt having a monovalent anion.

10. The plating solution of claim 5 wherein the anion is nitrate or formate.

11. The plating solution of claim 5 containing a stabilizer in a concentration less than that amount that would reduce elongation capability below about 10 percent.

12. The plating solution of claim 11 containing stabilizers selected from the group of cyanide ions, dipyridyl compounds, mercury compounds and alkyne alcohols and mixtures thereof.

13. The plating solution of claim 12 containing dipyridyl.

14. The plating solution of claim 12 containing an alkyne alcohol.

* * * * *